United States Patent
Chao et al.

(10) Patent No.: US 7,663,299 B2
(45) Date of Patent: Feb. 16, 2010

(54) FULL-COLOR ORGANIC ELECTROLUMINESCENCE DISPLAY PANEL HAVING SUB PIXEL REGIONS

(75) Inventors: Ching-Ian Chao, Hsinchu (TW); Chun-Te Lu, Hsinchu (TW)

(73) Assignees: Industrial Technology Research Institute, Hsinchu (TW); WorldLED Co., Ltd., Tai-Chung (TW)

( * ) Notice: Subject to any disclaimer, the term of this patent is extended or adjusted under 35 U.S.C. 154(b) by 524 days.

(21) Appl. No.: 10/973,558

(22) Filed: Oct. 26, 2004

(65) Prior Publication Data

US 2006/0033422 A1    Feb. 16, 2006

(30) Foreign Application Priority Data

Aug. 10, 2004    (TW) .............................. 93123915 A (51) Int. Cl.
*H01J 1/62* (2006.01)
(52) U.S. Cl. ..................... 313/500; 313/503; 313/504; 313/505
(58) Field of Classification Search .............. 313/500, 313/503–505
See application file for complete search history.

(56) References Cited

U.S. PATENT DOCUMENTS

| 5,493,410 A | * | 2/1996 | Oikawa ..................... 358/3.15 |
| 2004/0108818 A1 | | 6/2004 | Cok et al. |
| 2005/0001542 A1 | * | 1/2005 | Kiguchi ..................... 313/504 |

FOREIGN PATENT DOCUMENTS

| CN | 1425267 A | 6/2003 |
| JP | 2004-207126 | 7/2004 |

* cited by examiner

*Primary Examiner*—Bumsuk Won
(74) *Attorney, Agent, or Firm*—Rabin & Berdo, P.C.

(57) ABSTRACT

A full-color organic electroluminescence (OEL) display panel includes a substrate and a plurality of full-color OEL pixel devices in a matrix form as a display frame. Each of the pixel devices is composed of a plurality of sub-pixel regions, corresponding to R, G or B colors. Each of the specific color sub-pixel regions in the pixel device abuts the same specific color sub-pixel region of the adjacent pixel device thereof to form a double-sized emission area. With this arrangement of sub-pixel regions, it is easier to manufacture (a) high-resolution full-color OLED panels by a metal-mask alignment process, and (b) high-resolution full-color PLED panels by an ink-jet printing process.

23 Claims, 7 Drawing Sheets

FULL-COLOR ORGANIC ELECTROLUMINESCENCE DISPLAY PANEL HAVING SUB PIXEL REGIONS

BACKGROUND OF THE INVENTION

1. Field of Invention

The invention pertains to an organic electroluminescence (OEL) display panel, and particularly to a full-color OEL display panel.

2. Background of the Related Art

An organic electroluminescence (OEL) device possesses the advantages of both a liquid crystal display (LCD) and an inorganic light-emitting diode (LED), such as compact size, high resolution, low power consumption, self-emission and fast response. Thus, an OEL device is considered to be a promising candidate for the next-generation of flat display panels.

Nowadays, full-color capability has gradually become a basic requirement for display panels. Furthermore, the quality demanded of full-color display panels has increased progressively. One important index for display panel quality is resolution that is defined by units of dpi (dot per inch). Generally, the pixel device of a display panel is composed of red (R), green (G) and blue (B) sub-pixel regions (hereinafter referred to as R, G and B sub-pixel regions) so as to provide full-color effects by mixing the light of these colors emitted from the individual sub-pixel regions of the pixel device. For current full-color LCD or OEL display panels, the sub-pixel regions therein are generally arranged in a stripe form, a mosaic form or a delta form.

Figure 1A:
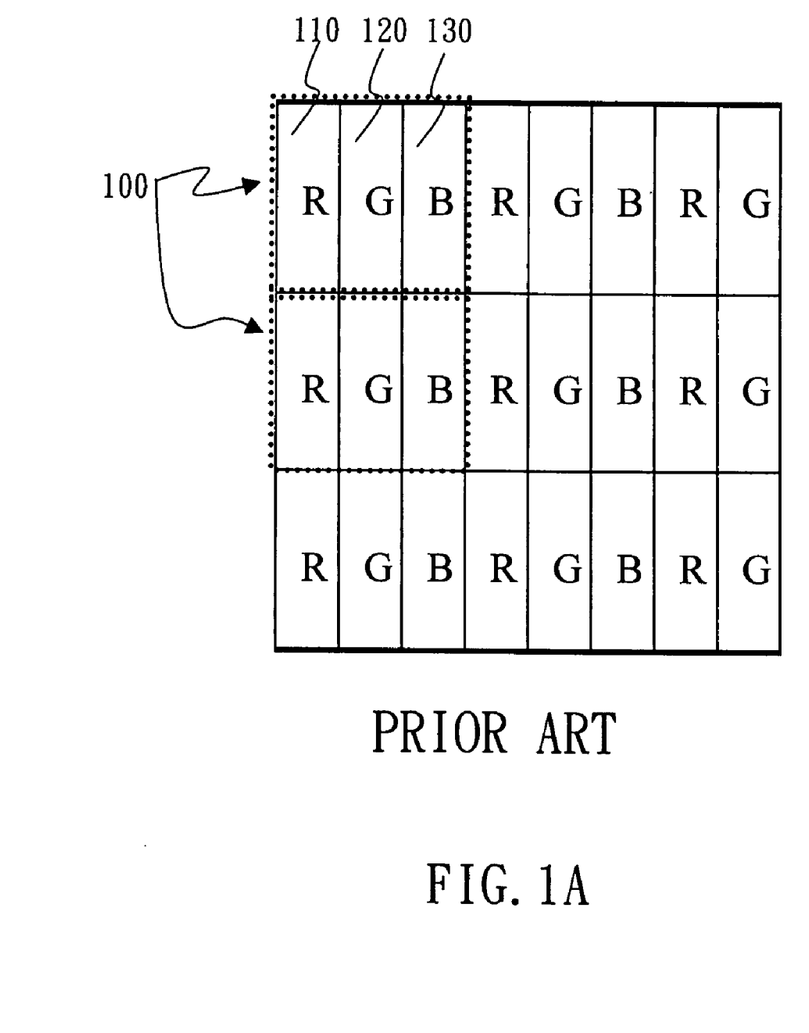
FIG. 1A is a schematic sub-pixel region arrangement in a prior full-color OEL display panel, which is in a stripe form.
Figure 1B:
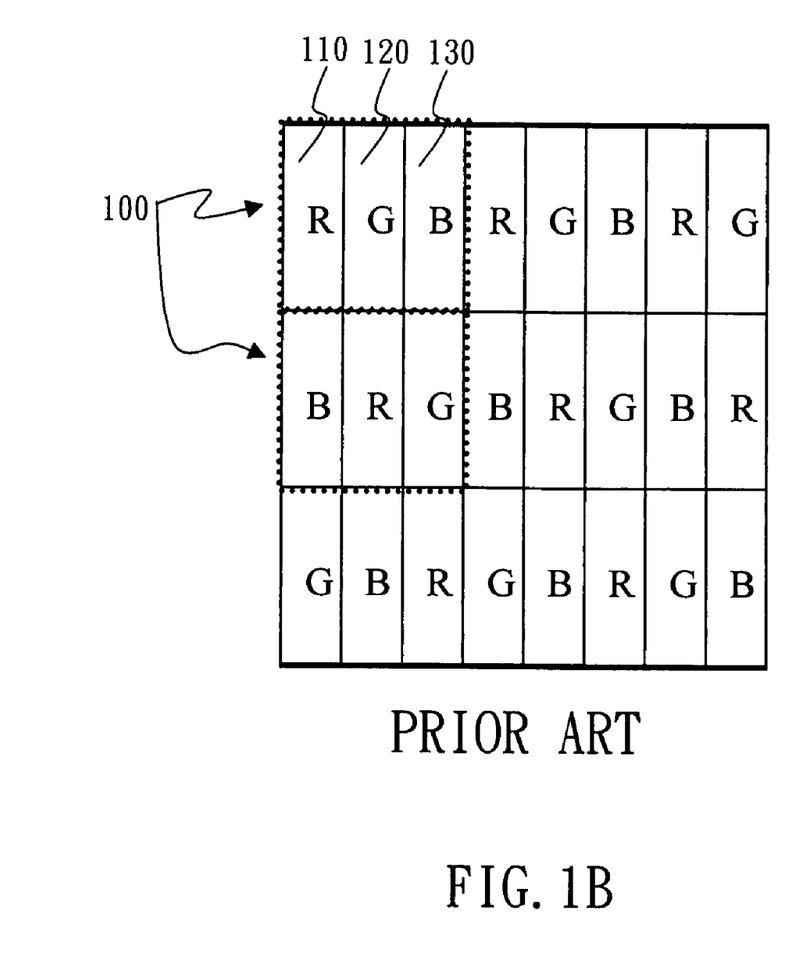
FIG. 1B is a schematic sub-pixel region arrangement in a prior full-color OEL display panel, which is in a mosaic form.
Figure 1C:
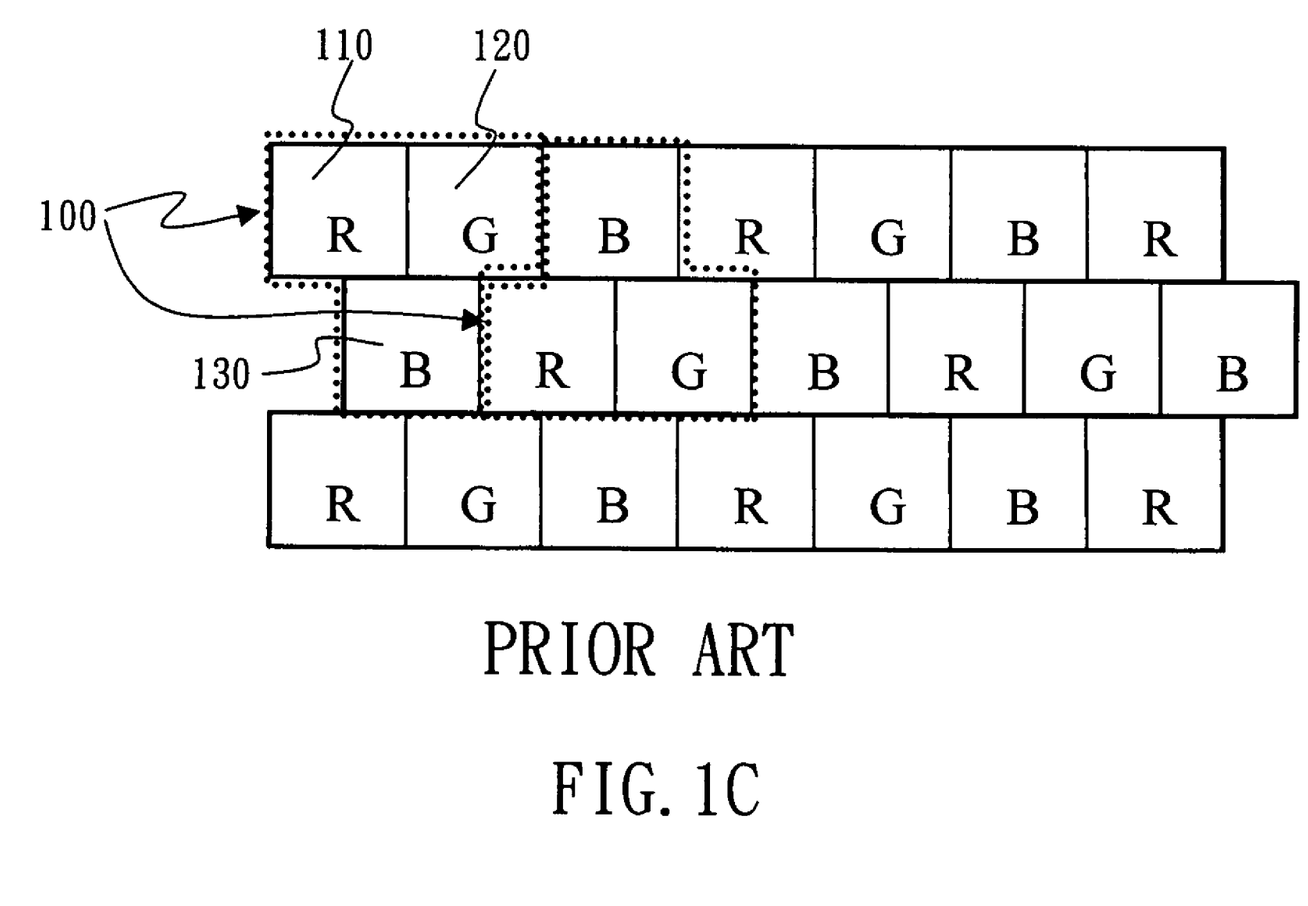
FIG. 1C is a schematic sub-pixel region arrangement in a prior full-color OEL display panel, which is in a delta form.

The sub-pixel region arrangement based on the prior stripe form may be seen in FIG. 1A, in which each pixel device 100 in the matrix form is composed of R, G and B sub-pixel regions 110, 120, and 130 arranged row by row on a substrate. This arrangement is the simplest in terms of its manufacturing process, circuit design and driving method. However, the color mixing effect from the stripe-form display panel is the poorest. Refer to FIG. 1B for the prior sub-pixel region arrangement in a mosaic form, in which each two adjacent R, G and B sub-pixel regions 110, 120, and 130 are separated by the width of one sub-pixel region. Using this sub-pixel region arrangement, the color mixing effect from the corresponding display panel is improved. However, the circuit design and the driving method are complicated. Refer to FIG. 1C for the prior sub-pixel region arrangement in a delta form, in which each two adjacent R, G and B sub-pixel regions 110, 120, and 130 are separated by the width of 1.5 sub-pixel regions. Using this sub-pixel region arrangement, the color mixing effect from the corresponding display panel is further improved. However, the circuit design and the manufacturing process of the delta-form display panel are more complicated.

No matter which sub-pixel region arrangement is adopted in achieving full-color display capability, the manufacturing process of the sub-pixel regions determines the resolution of the full-color OEL display panel.

OEL devices generally are simply classified according to the EL materials used; the device using small molecules is called an organic light-emitting diode (OLED), the device using polymers is called a polymer light-emitting diode (PLED).

For a current full-color OLED device with RGB side-by-side format, a metal-mask alignment method is generally utilized to form the individual RGB sub-pixels. Therefore, the resolution of a OLED panel depends on the opening dimensions of the metal mask, which is related to the thickness of the metal mask and the ability of fine etching. Presently, the opening of a 30-micrometer(um)-thick metal mask is about 60 to 90 um. Therefore, a metal mask with 70 um opening can be utilized to make a full-color OLED panel with 121-dpi resolution. If a higher resolution of the OLED panel is required, a thinner metal mask or a finer etching skill has to be taken, which poses a considerable level of difficulty in the display panel manufacturing process.

For a full-color PLED panel, an ink-jet printing (IJP) method is often used, which is generally known as a precise and high-reproductive coating process. Hence, the IJP method could meet the requirements of automatic, miniaturized, low-cost, high-throughput and low-environment-impact manufacturing process. As for IJP, the higher the panel resolution is, the smaller the drop size is. However, in most situations, smaller ink drops pose a higher level of difficulty in the design of ink-jet head. Therefore, an important issue for the design of full-color OEL display panels is how to make an efficient arrangement of sub-pixel regions in the display panel.

SUMMARY OF THE INVENTION

In view of the disadvantages encountered in the prior art, the invention provides a full-color organic electroluminescence (OEL) display panel, in which each of the sub-pixel regions in the display panel are designed in a specific arrangement. A sub-pixel region corresponding to a specific color is designed to combine with an adjacent sub-pixel region that corresponds to the same color to form a double-sized geometrical emission area. As such, a full-color OEL display will be manufactured easily, i.e., using the current process can fulfill a higher-resolution full-color OEL display. At the same time, since the sub-pixels in the full-color OEL display panel are arranged approximately in a delta form, the effect of color mixing is maintained at a good level.

The full-color OEL display panel according to the invention comprises a substrate and a plurality of OEL pixel devices as a display frame. In each of the pixels, R, G and B sub-pixels are included to achieve the effect of full color.

Each specific-color sub-pixel region in the pixel device abuts the same-color sub-pixel region of the adjacent pixel device. Adjacent sub-pixel regions with the same color are combined into a double-sized emission area in the display panel. For the same-resolution OLED panel, the opening of the metal mask for RGB sub-pixels in the OLED panel is also double-sized, so that the etching process for a metal mask becomes easier. For the same-resolution PLED panel, the design and alignment control of the ink-jet printing used for manufacturing a full-color PLED panel is also more easily performed. On the other hand, as compared to the prior art, the invention could provide a higher-resolution full-color OEL display panel with current manufacturing skills.

According to the invention, the substrate used in the full-color OEL display panel may be glass, quartz or plastic. The display panel may be an active-matrix form or a passive-matrix form. In addition, the OEL display panel may adopt top-emission type or bottom-emission type.

Other objects, advantages and features of the invention may be further understood through the detailed description below in connection with the drawings.

BRIEF DESCRIPTION OF THE DRAWINGS

The invention will become more fully understood through the detailed description given below for only an exemplary sense, and thus are not limitative of the present invention, and wherein.

DETAILED DESCRIPTION OF THE INVENTION

The full-color OEL display panel according to the invention comprises a substrate and a plurality of OEL pixel devices as a display frame. In the pixel devices, the sub-pixel regions are designed in a specific arrangement to reduce the level of difficulty in the manufacturing process, and provide better effect of color mixing in the full-color OEL display panel.

Figure 2:
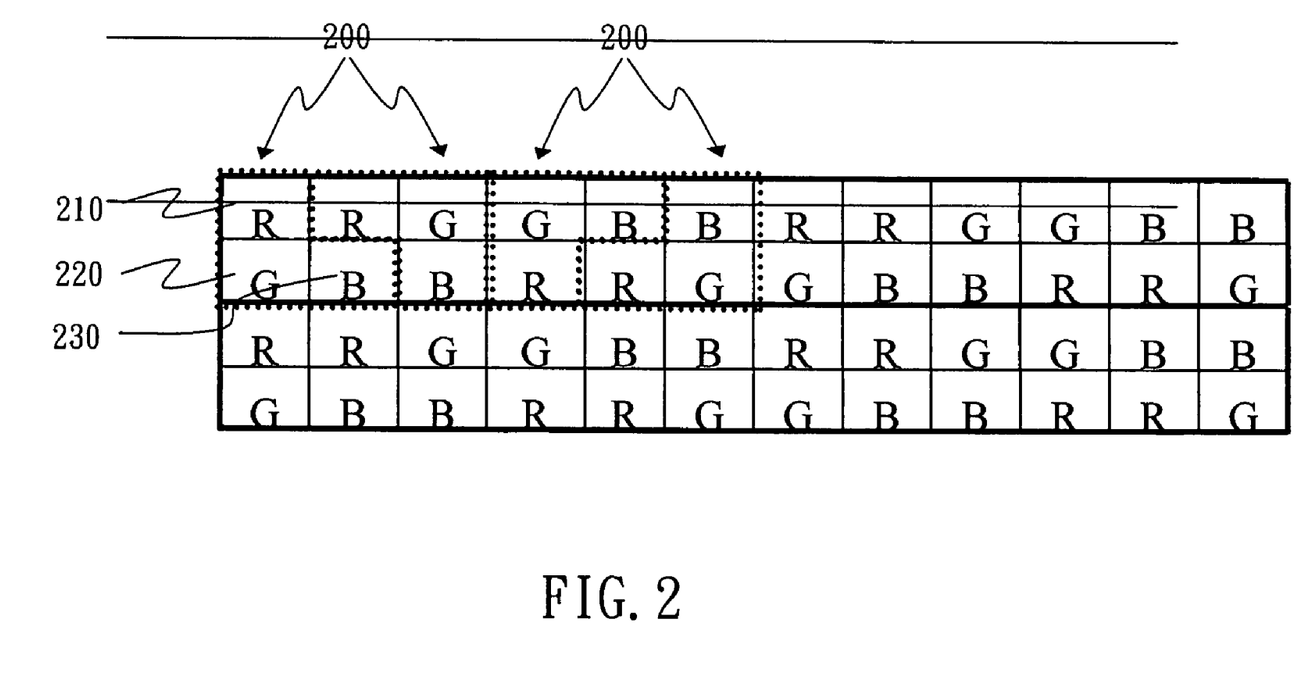
FIG. 2 is a schematic sub-pixel region arrangement in a full-color OEL display panel of a first embodiment of the invention.

FIG. 2 illustrates a schematic sub-pixel region arrangement in a full-color OEL display panel having sub-pixel regions of a first embodiment of the invention. Each pixel device 200 (the range limited by the dotted frame) has an "L" shape and comprises an R sub-pixel region 210, a G sub-pixel region 220 and a B sub-pixel region 230. Each four consecutive pixels with the same arrangement of the R, G and B sub-pixel regions 210, 220, and 230 is taken as a unit and repeats each unit with an arrangement of the R, G and B sub-pixel regions 210, 220, and 230. Therefore, each specific color sub-pixel region of pixel devices 200 abuts the same color sub-pixel region of the adjacent pixel device 200. That is, the R, G and B sub-pixel regions 210, 220, and 230 are respectively formed virtually with a double-sized rectangular emission area, as compared to the traditionally manufactured single sub-pixel area in the prior art. As a whole, the sub-pixel region arrangement in the first embodiment is similar to the prior delta arrangement and thus the effect of the color mixing in the display panel can be maintained at a better level.

As far as the manufacturing process of a OLED panel is concerned, if the opening of the metal mask has a minimum dimension of 70 micrometers, the corresponding pixel device has a square shape with the dimensions of 210 micrometers× 210 micrometers, and each of the sub-pixel region in the pixels has a width of 70 micrometers and a height of 210 micrometers as shown in FIG. 1A, this corresponds to a resolution of 121 dpi.

In comparison with a prior display panel having a stripe arrangement, each of the R, G and B sub-pixel regions in the pixel devices 200 in the format of the four consecutive pixel units (as shown in FIG. 2) is adapted to have a width of 140 micrometers and a height of 105 micrometers, corresponding to the same resolution of 121 dpi, to nominally be the same square of the pixel devices as that in the prior display panel. In this manner, the opening of the metal mask required for the manufacturing of the display panel is 280 micrometers in width and 105 micrometers in height. Accordingly, the metal mask used in manufacturing the display panel according to the invention may be thicker and have a larger opening. That is, the metal mask used in the invention is easier to manufacture and less likely to become deformed, and the coating alignment in manufacturing the sub-pixel regions is more precise. Therefore, the difficulties in the alignment process of RGB sub-pixel coating and in the manufacturing process of the metal mask used in manufacturing the corresponding display panel may be both reduced.

In addition, the invention also has the advantage of producing a full-color OLED panel with a higher resolution by using the currently used metal mask. Specifically, in order to maintain the pixel 200 as shown in FIG. 2 as a nominal square and use the same dimension of 70 micrometers for the metal mask opening, each of the corresponding sub-pixel regions having a double-sized emission area has a width of 93.3 micrometers and a height of 70 micrometers, the corresponding width and height of the metal mask opening is 186.7 micrometers and 70 micrometers, corresponding to a higher resolution of 181 dpi.

The invention may also be applied to manufacture of a full-color PLED panel. When a reasonable ink drop of 35 picoliters (pl) is used, the ink drop is approximately 40 micrometers in diameter. Assuming the distance between the ink-jet head and the substrate is 600 micrometers, each of the pixel devices is 210 micrometers×210 micrometers square and each of the sub-pixel regions has a width of 70 micrometers and a height of 210 micrometers. However, the actual width of the sub-pixel region is only 56 micrometers since a bank is generally disposed around the sub-pixel regions, the width of the bank usually accounts for 20% of that of the sub-pixel region, to avoid overflowing of the dispensed ink drops. If the prior stripe arrangement is adopted to form the full-color PLED panel with the 121 dpi resolution, the angle of the ink drops from the ink jet head must have an error of less than ±0.76 degrees to prevent ink from overflowing and thus color mixing.

In comparison with a prior display panel having the stripe arrangement, each of the R, G and B sub-pixel regions in the pixel devices 200 in the format of four consecutive pixel unit (as shown in FIG. 2) is adapted to have a width of 140 micrometers and a height of 105 micrometers, to nominally be the same square of the pixel devices as that in the prior display panel. In this manner, the width and the height of each of the double-sized emission area with two sub-pixel regions with the same color are 280 micrometers and 105 micrometers. With consideration of the bank disposed for the sub-pixel region, the internal length of the shorter side of the sub-pixel region is 84 micrometers, and the corresponding resolution of the display panel is 121 dpi. In the case, the angle error of the ink-jet printing must be less than ±2.1 degrees. Accordingly, the invention may allow having a larger angular error of ink-jet printing and thus reduce the level of difficulty in the alignment process of the manufacturing of the full-color PLED display panel.

In addition, the invention also has the advantage of producing a full-color PLED panel with a higher resolution by using the currently used ink-jet printing skill, that is, angle error less than ±0.76 degrees. Specifically, in order to maintain the single pixel device in the display panel nominally as a square, each of the sub-pixel regions in the pixel devices 200 in the format of four consecutive pixel units (as shown in FIG. 2) is adopted to have a width of 93.3 micrometers and a height of 70 micrometers. In this manner, the height and the width of each of the double-sized emission area with two sub-pixel regions with the same color are 186.7 micrometers and 70 micrometers, respectively. With consideration of the bank disposed around the sub-pixel region, the internal length of the shorter side of the sub-pixel is 56 micrometers, which is the same as that of the prior full-color PLED panel. In this case, the currently used ink-jet printing skill having an angular precision of less than ±0.76 degrees may be used in the invention to obtain a PLED panel with a higher resolution of 181 dpi.

Figure 3:
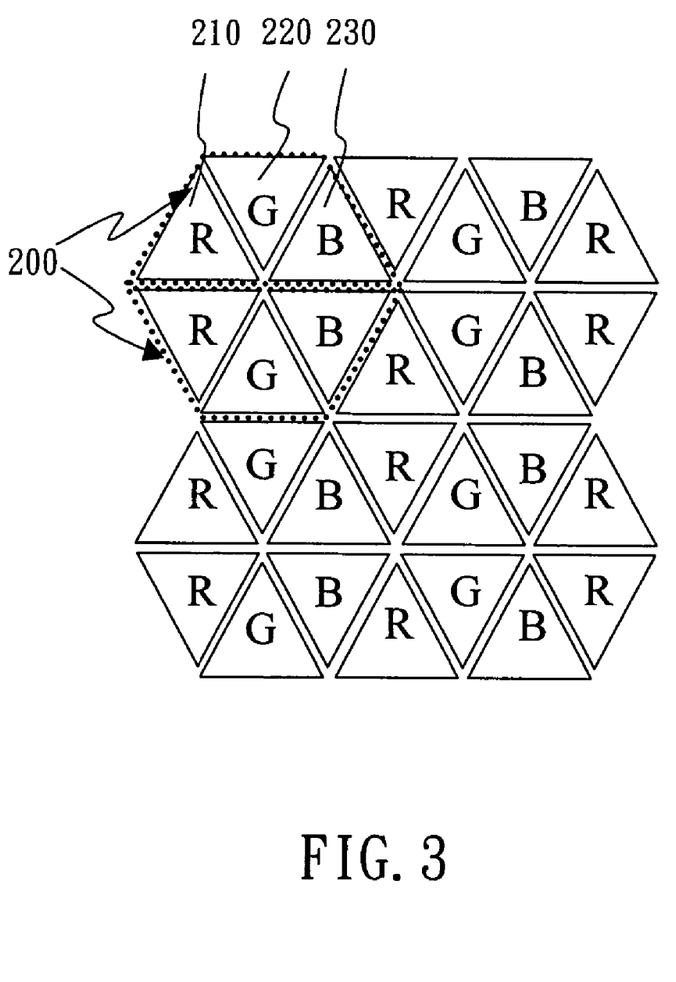
FIG. 3 is a schematic sub-pixel region arrangement in the full-color OEL display panel of a second embodiment of the invention.

Other different sub-pixel region arrangements may be possible based on the same principle as mentioned above. FIG. 3 illustrates a sub-pixel region arrangement of a second embodiment of the invention. As shown, each pixel device 200 (the range limited by the dotted frame) of the display panel is a trapezoid composed of a triangular R sub-pixel region 210, a triangular G sub-pixel region 220 and a triangular B sub-pixel region 230. Each specific color sub-pixel region of the pixel device 200 abuts the same color sub-pixel region of the adjacent pixel device 200 thereof and the two adjacent sub-pixel regions form a double-sized quadrangular emission area. The specific color may be red, green or blue. As a whole, since the RGB sub-pixel region arrangement is approximate to the prior delta form, the resulting effect of the color mixing is maintained at a better level.

Figure 4:
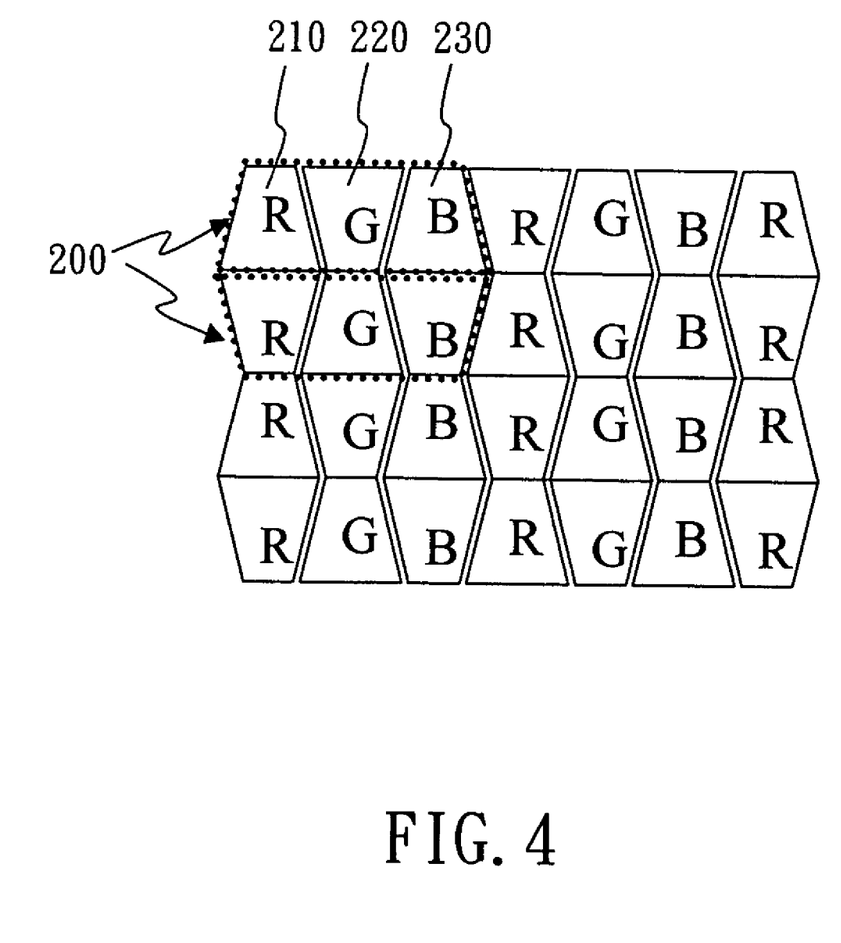
FIG. 4 is a schematic sub-pixel region arrangement in the full-color OEL display panel of a third embodiment of the invention.

FIG. 4 illustrates a sub-pixel region arrangement of a third embodiment of the invention, which is also deduced by the principle mentioned above. As shown, each pixel device 200 (the range limited by the dotted frame) of the display panel is composed of a trapezoid R sub-pixel region 210, a trapezoid G sub-pixel region 220 and a trapezoid B sub-pixel region 230. Each specific color sub-pixel of the pixel device 200 abuts the same color sub-pixel region of the adjacent pixel device 200 and the two adjacent sub-pixel regions with the same color form a double-sized hexagonal emission area. The specific color may be red, green or blue. As a whole, since the RGB sub-pixels arrangement is approximate to the prior delta form, the resulting effect of the color mixing is maintained at a better level.

Figure 5:
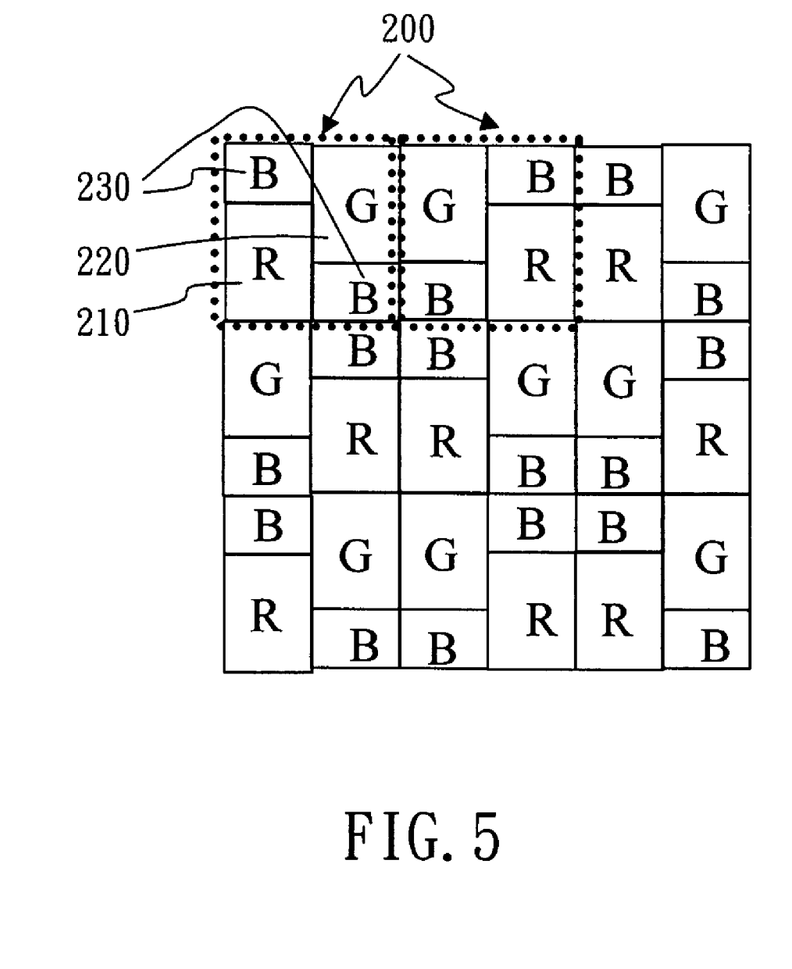
FIG. 5 is a schematic sub-pixel region arrangement in the full-color OEL display panel of a forth embodiment of the invention.

FIG. 5 illustrates a sub-pixel region arrangement of a fourth embodiment of the invention, which is also deduced by the principle mentioned above. As shown, each pixel device 200 (the range limited by the dotted frame) of the display panel is composed of a rectangular R sub-pixel region 210, a rectangular G sub-pixel region 220 and two rectangular B sub-pixel regions 230 each having a smaller area. Each sub-pixel region of pixel device 200 abuts the same color sub-pixel region of the adjacent pixel device to form a double-sized rectangular emission area. In this embodiment, the arrangement of RGB color can be exchanged one another. As a whole, since the RGB sub-pixel arrangement is approximate to the prior delta form, the resulting effect of color mixing is maintained at a better level.

Preferably, the geometrical shape of the combination of the adjacent sub-pixels having the same color is approximately rectangular. However, any arrangement that constitutes a double-sized emission area with the same color sub-pixel regions is deemed deduced from the invention. Namely, each of the sub-pixel regions may be any regular polygon or a geometrical shape comprising an arc shape other than the shapes mentioned above. In addition, the R, G and B sub-pixel regions may be in different shapes and thus the double-sized emission area may be a combination of different geometrical shapes.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

The invention claimed is:

1. A full-color organic electroluminescence (OEL) display panel having sub-pixel regions, comprising:
   a substrate; and
   a plurality of pixel devices disposed on the substrate in a matrix form as a display frame, each pixel device including a plurality of the sub-pixel regions, wherein
   each sub-pixel region has a specific color, and abuts a sub-pixel region of the same specific color in an adjacent pixel device, so that the abutting sub-pixel regions of the same specific color form a double-sized emission area of the same specific color; and
   the plurality of the sub-pixel regions are arranged to repeat every four pixel devices, each of the four pixel devices having a different arrangement of the sub-pixel regions.

2. The full-color organic electroluminescence (OEL) display panel having sub-pixel regions of claim 1, wherein the substrate is comprised of a material selected from the group consisting of glass, quartz and plastic.

3. The full-color organic electroluminescence (OEL) display panel having sub-pixel regions of claim 1, wherein the plurality of the sub-pixel regions include a red sub-pixel region, a green sub-pixel region and a blue sub-pixel region.

4. The full-color organic electroluminescence (OEL) display panel having sub-pixel regions of claim 1, wherein the plurality of the sub-pixel regions are driven in one of active-matrix scheme or passive-matrix scheme.

5. The full-color organic electroluminescence (OEL) display panel having sub-pixel regions of claim 1, wherein the plurality of the sub-pixel regions are one of top-emission devices or bottom-emission devices.

6. The full-color organic electroluminescence (OEL) display panel having sub-pixel regions of claim 1, wherein the plurality of the sub-pixel regions is an organic light-emitting diode (OLED).

7. The pixel device arrangement of claim 1, wherein the plurality of the sub-pixel regions is a polymer light-emitting diode (PLED).

8. The full-color organic electroluminescence (OEL) display panel having sub-pixel regions of claim 1, wherein the geometrical shapes of all of the plurality of the sub-pixel regions are the same as each other within each one of the plurality of pixel devices.

9. The full-color organic electroluminescence (OEL) display panel having sub-pixel regions of claim 1, wherein the plurality of the sub-pixel regions of each pixel device is arranged non-linearly.

10. The full-color organic electroluminescence (OEL) display panel having sub-pixel regions of claim 9, wherein the non-linear arrangement of the plurality of the sub-pixel regions of each pixel device provide pixel devices having an approximately "delta" shape.

11. The full-color organic electroluminescence (OEL) display panel having sub-pixel regions of claim 1, wherein the plurality of the sub-pixel regions are arranged to repeat every four pixel devices along a horizontal arrangement direction.

12. The full-color organic electroluminescence (OEL) display panel of claim 1, wherein each of the four pixel devices has a same combination of the sub-pixel regions, each combination of the sub-pixel regions forming a same shape.

13. A full-color organic electroluminescence (OEL) display panel having sub-pixel regions, comprising:
   a substrate; and
   a plurality of pixel devices formed on the substrate in a matrix form as a display frame and each comprising a plurality of the sub-pixel regions having respective specific colors, wherein each pixel device has edges thereof adjacent to other pixel devices, each sub-pixel region thereof along the edges of the pixel device abuts at least one same-color sub-pixel region of at least one of the other pixel devices to form a double-sized emission area of a single color, and the plurality of the sub-pixel regions are arranged to repeat every four pixel devices, each of the four pixel devices having a different arrangement of the sub-pixel regions.

14. The full-color OEL display panel having sub-pixel regions of claim 13, wherein the plurality of the sub-pixel regions of each pixel device is arranged non-linearly.

15. The full-color OEL display panel having sub-pixel regions of claim 14, wherein the non-linear arrangement of the plurality of the sub-pixel regions of each pixel device provide pixel devices having of an approximately "delta" shape.

16. The full-color OEL display panel having sub-pixel regions of claim 14, wherein each of the plurality of the sub-pixel regions has a geometrical shape which is one of triangular or trapezoidal, and the non-linear arrangement of the plurality of the sub-pixel regions of each pixel device provide pixel devices having a shape which is an approximately "delta" shape.

17. A full-color organic electroluminescence (OEL) display panel having sub-pixel regions, comprising:

a substrate; and a plurality of pixel devices disposed on the substrate in a matrix form as a display frame, each pixel device including a plurality of the sub-pixel regions, wherein each sub-pixel region has a specific color, and abuts a sub-pixel region of the same specific color in an adjacent pixel device, so that the abutting sub-pixel regions of the same specific color form a double-sized emission area of the same specific color; and the plurality of the sub-pixel regions are arranged to repeat every four pixel devices, at least one of the four pixel devices having a sub-pixel region arrangement different from sub-pixel region arrangements of the others of the four pixel devices.

18. The full-color organic electroluminescence (OEL) display panel having sub-pixel regions of claim 17, wherein the plurality of the sub-pixel regions have a geometrical shape selected from the group consisting of rectangular, trapezoid, angular, regular polygon and a geometrical shape having an arc.

19. The pixel device arrangement of claim 18, wherein in each one of the plurality of pixel devices, the geometrical shapes of the respective sub-pixel regions thereof are not all the same.

20. The full-color organic electroluminescence (OEL) display panel having sub-pixel regions of claim 17, wherein each of the plurality of the sub-pixel regions of the pixel devices has a geometrical shape which is triangular.

21. The full-color organic electroluminescence (OEL) display panel having sub-pixel regions of claim 17, wherein each of the plurality of the sub-pixel regions of the pixel devices has a geometrical shape which is trapezoidal.

22. The full-color organic electroluminescence (OEL) display panel having sub-pixel regions of claim 17, wherein the plurality of the sub-pixel regions of each pixel device is arranged non-linearly and each of the plurality of the sub-pixel regions of the pixel devices has a geometrical shape which is one of triangular or trapezoidal, and the non-linear arrangement of the plurality of the sub-pixel regions of each pixel device provide pixel devices having a shape which is of an approximately "delta" shape.

23. The full-color organic electroluminescence (OEL) display panel having sub-pixel regions of claim 17, wherein the plurality of the sub-pixel regions are arranged to repeat every two pixel devices along a horizontal arrangement direction, and to repeat every two pixel devices along a vertical arrangement direction.

* * * * *